(12) United States Patent
Ma et al.

(10) Patent No.: US 12,439,732 B1
(45) Date of Patent: Oct. 7, 2025

(54) TIME-OF-FLIGHT PIXEL SENSOR WITH HIGH MODULATION CONTRAST

(71) Applicant: Gigajot Technology Inc., Pasadena, CA (US)

(72) Inventors: Jiaju Ma, Monrovia, CA (US); Michael Guidash, Fairport, NY (US)

(73) Assignee: Gigajot Technology, Inc., Pasadena, CA (US)

( * ) Notice: Subject to any disclaimer, the term of this patent is extended or adjusted under 35 U.S.C. 154(b) by 990 days.

(21) Appl. No.: 17/033,248

(22) Filed: Sep. 25, 2020

Related U.S. Application Data

(60) Provisional application No. 62/942,532, filed on Dec. 2, 2019, provisional application No. 62/905,883, filed on Sep. 25, 2019.

(51) Int. Cl.
| | |
|---|---|
| *H01L 31/02* | (2006.01) |
| *G01S 7/4863* | (2020.01) |
| *H01L 31/0232* | (2014.01) |
| *H01L 31/103* | (2006.01) |
| *H10F 30/221* | (2025.01) |
| *H10F 77/00* | (2025.01) |
| *H10F 77/40* | (2025.01) |

(52) U.S. Cl.
CPC .......... *H10F 77/953* (2025.01); *G01S 7/4863* (2013.01); *H10F 30/221* (2025.01); *H10F 77/413* (2025.01)

(58) Field of Classification Search
CPC ..... H01L 25/0753; H01L 33/58; H01L 33/62; G01S 7/4863; H10F 30/221; H10F 77/413; H10F 77/953

USPC .................................................. 257/89, 413
See application file for complete search history.

(56) References Cited

U.S. PATENT DOCUMENTS

| | | | |
|---|---|---|---|
| 7,626,685 B2 | 12/2009 | Jin et al. | |
| 7,994,465 B1 | 8/2011 | Bamji et al. | |
| 8,294,880 B2 | 10/2012 | Jin et al. | |
| 8,665,422 B2 | 3/2014 | Mase et al. | |
| 8,952,427 B2 | 2/2015 | Suzuki et al. | |
| 9,076,706 B2 | 7/2015 | Kim et al. | |
| 9,117,712 B1 | 8/2015 | Oggier et al. | |
| 9,324,758 B2 | 4/2016 | Oh et al. | |
| 10,319,776 B2 | 6/2019 | Ma et al. | |
| 2016/0056199 A1* | 2/2016 | Kim | H01L 27/14603 257/233 |
| 2016/0133659 A1* | 5/2016 | Chao | H04N 23/11 257/225 |
| 2016/0225922 A1* | 8/2016 | Akkaya | H01L 31/028 |
| 2018/0226439 A1 | 8/2018 | Oda et al. | |
| 2019/0181171 A1* | 6/2019 | Tadmor | H01L 27/14605 |
| 2019/0252455 A1 | 8/2019 | Pattantyus-Abraham et al. | |

(Continued)

*Primary Examiner* — Fazli Erdem
(74) *Attorney, Agent, or Firm* — Robert C. Kowert; Kowert, Hood, Munyon, Rankin & Goetzel, P.C.

(57) ABSTRACT

First and second modulation gates disposed adjacent a silicon photoconversion structure generate, throughout the exposure interval, alternating first and second electrostatic fields that compel photocharge generated within the silicon photoconversion structure to the first and second storage diodes, respectively. Upon conclusion of the exposure interval, accumulated photocharge within the first and second storage diodes is transferred to first and second floating diffusion nodes, respectively, as part of a correlated-double-sampling readout with respect to each of the floating diffusion nodes.

21 Claims, 5 Drawing Sheets

(56) References Cited

U.S. PATENT DOCUMENTS

| | | | |
|---|---|---|---|
| 2019/0379844 A1* | 12/2019 | Chen | H01L 27/14652 |
| 2020/0103511 A1* | 4/2020 | Jin | G01S 7/499 |
| 2021/0029311 A1* | 1/2021 | Webster | H01L 27/14603 |

* cited by examiner

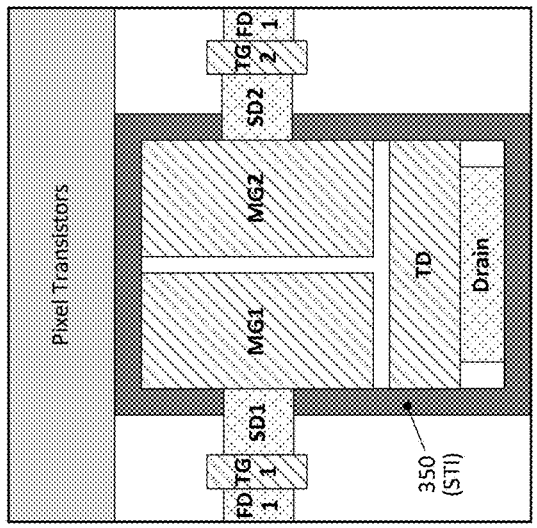
FIG. 7
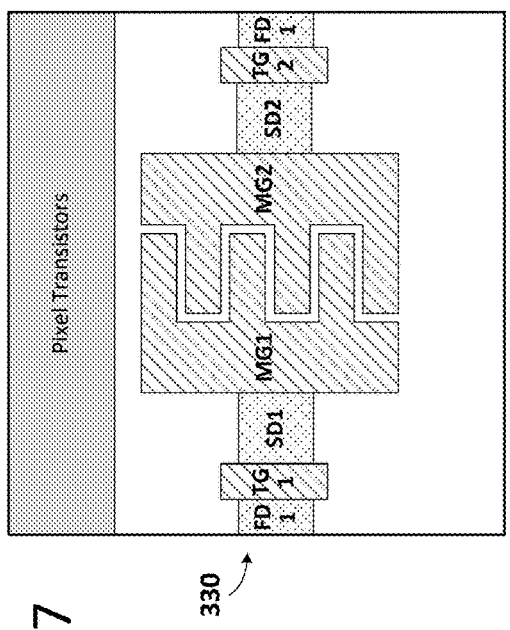
FIG. 8
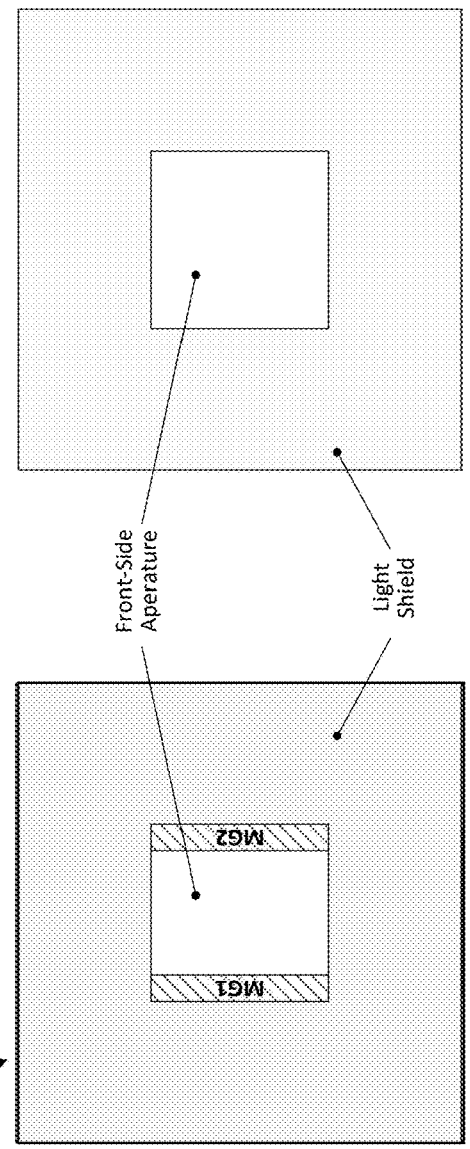
FIG. 9
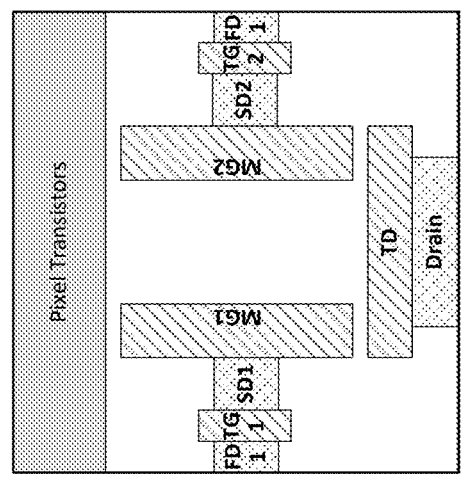

TIME-OF-FLIGHT PIXEL SENSOR WITH HIGH MODULATION CONTRAST

CROSS-REFERENCE TO RELATED APPLICATIONS

This application hereby claims priority to and incorporates by reference U.S. provisional application No. 62/905,883 filed Sep. 25, 2019 and U.S. provisional application No. 62/942,532 filed Dec. 2, 2019.

TECHNICAL FIELD

The disclosure herein relates to integrated-circuit sensors.

INTRODUCTION

Conventional time-of-flight (TOF) pixel sensors suffer from various combinations of high temporal noise, high power consumption, low charge modulation frequency, and high modulation latency, all of which lower modulation contrast and thus sensor precision. CAPD (current-assisted photonic demodulator) pixel sensors, for example, lack a lag-free charge readout mechanism (suffering significant temporal noise due to lack of kTC-noise-canceling correlated double sampling), consume a relatively high power due to constant current flow through forward-biased-diode modulation nodes and exhibit relatively long charge modulation latency due to the weak vertical electric field produced by the diode modulation nodes. PPD (pinned photodiode) pixel sensors similarly suffer from relatively high temporal noise (e.g., due to relatively low conversion gain on floating diffusion nodes) as well as low modulation frequency/low modulation contrast due to the relatively slow charge transfer in the path from PPD to floating diffusion.

DRAWINGS

The various embodiments disclosed herein are illustrated by way of example, and not by way of limitation, in the figures of the accompanying drawings and in which like reference numerals refer to similar elements and in which.

Figure 2:
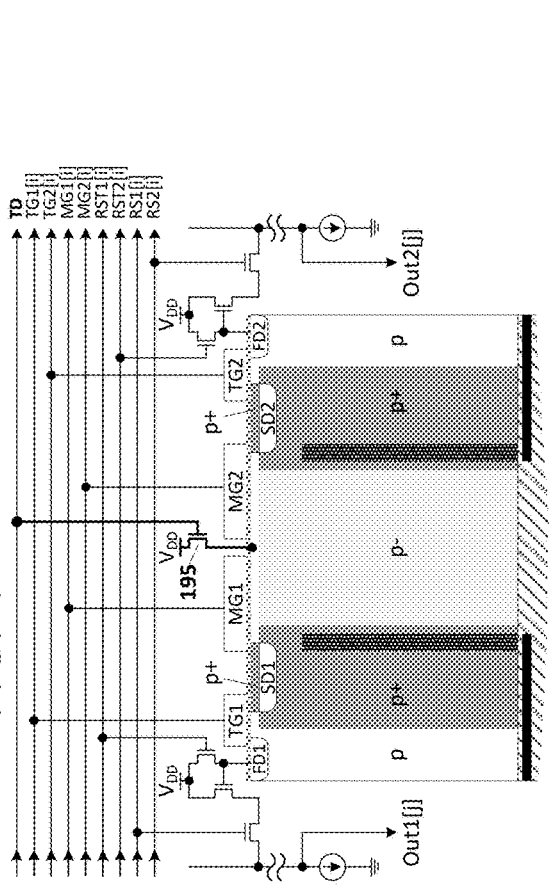
FIG. 2 illustrates an exemplary timing diagram showing an exposure interval and readout for one sub-frame within a dual-exposure (two sub-frame) image frame.
Figure 5:
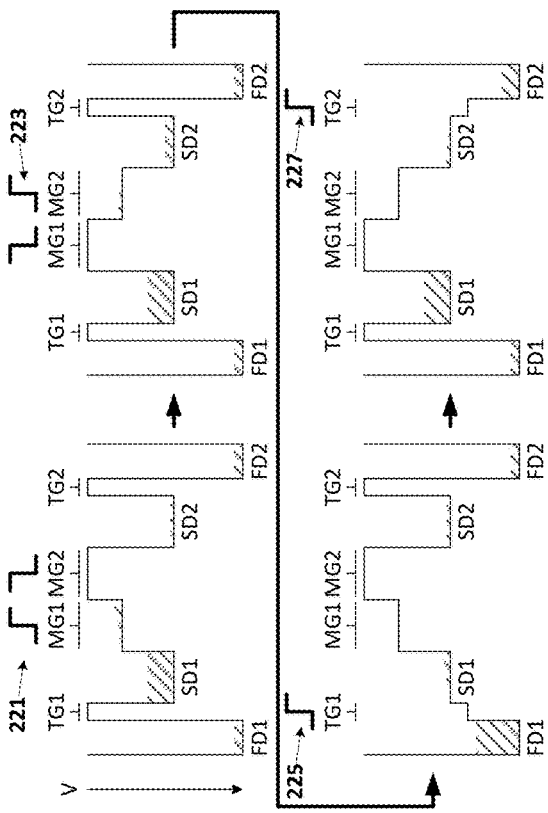
Figure 6:
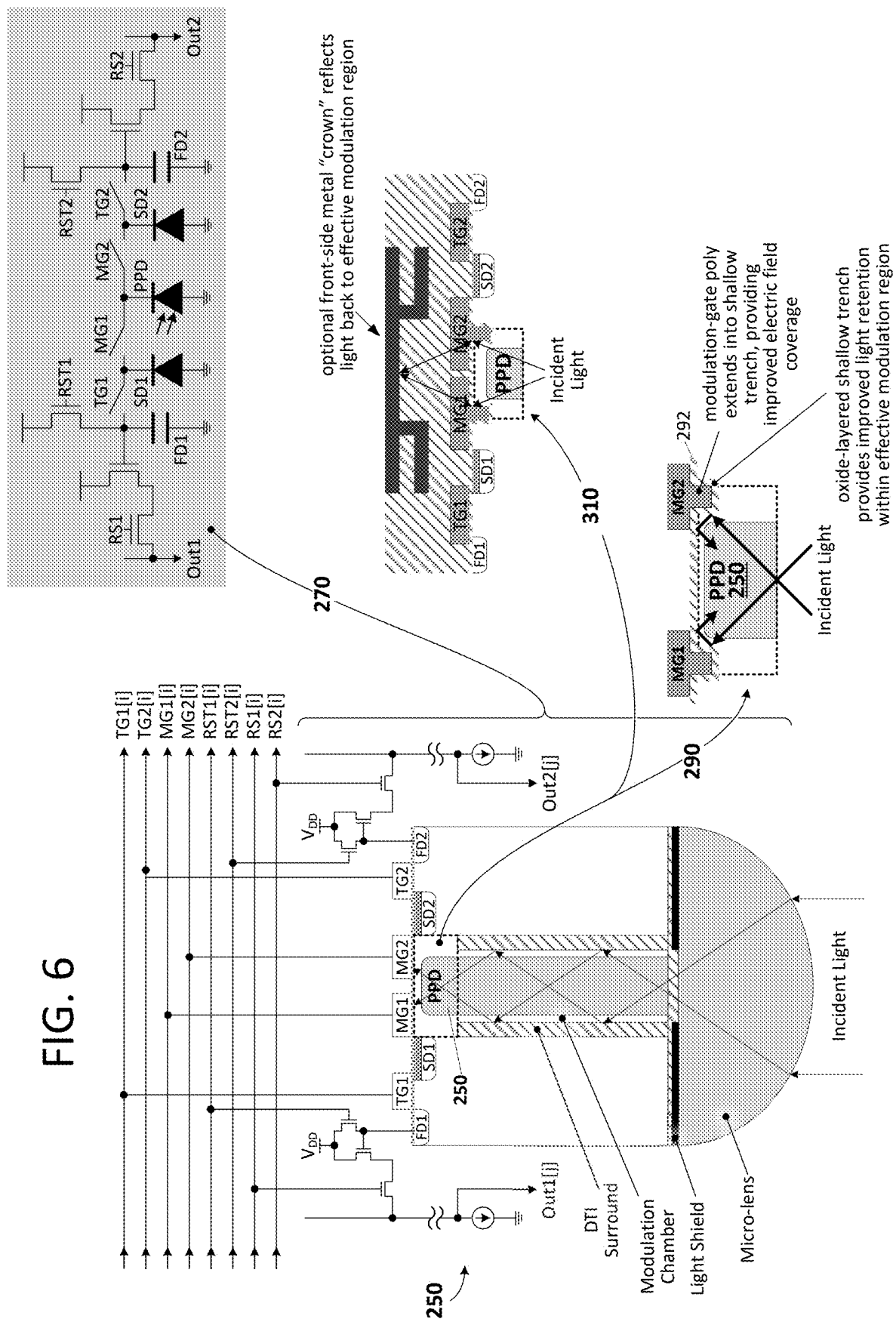
Figure 10:
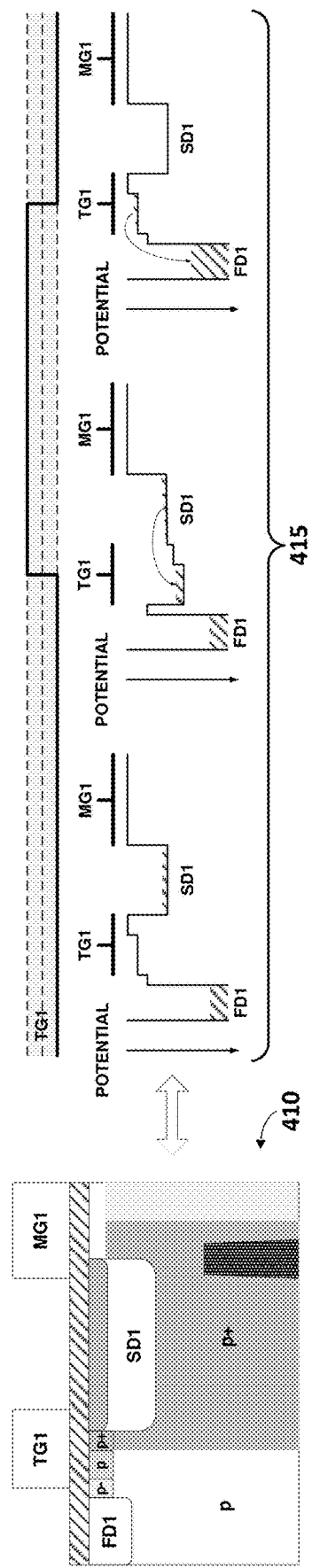
Figure 11:
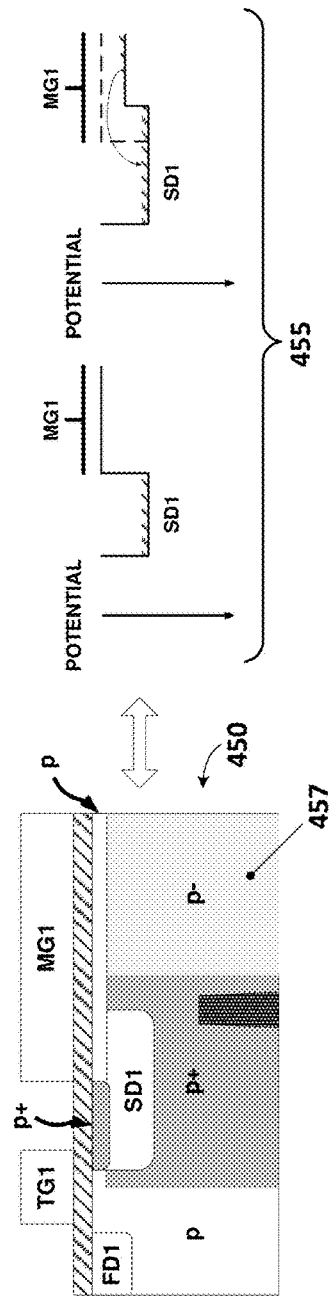

FIG. 5 presents an exemplary charge-transfer diagram corresponding to the timing diagram of FIG. 2, showing differential photocharge accumulation within storage diodes SD1 and SD2 during successive modulation phases;

FIG. 6 illustrates an alternative embodiment of high-modulation-contrast TOF pixel having a pinned photodiode disposed within the modulation chamber to improve photocarrier production efficiency;

FIG. 7 illustrates an exemplary interlocking modulation gate structure that may be implemented within the various high-modulation-contrast pixels discussed herein;

FIG. 8 illustrates a shallow-trench isolation structure that may act as a surround at the front-side periphery of a silicon photoconversion structure (or modulation chamber) to improve light retention and/or photocharge collection efficiency and thus increase modulation contrast;

FIG. 9 illustrates an alternative high-modulation-contrast TOF pixel having a front-side aperture;

FIG. 10 illustrates an exemplary cross-section (in part) and charge-transfer diagram for a high-modulation-contrast TOF pixel having a pump-gate readout architecture; and FIG. 11 illustrates an exemplary cross-section (in part) and charge-transfer diagram for a photo-gate architecture that may be deployed in region between the modulation gate and storage diode of the high-modulation-contrast TOF pixels discussed above.

DETAILED DESCRIPTION

In various embodiments herein, time-of-flight (TOF) pixel sensors are implemented with structures that increase vertical electric field strength and/or reduce charge transfer barriers between modulation zone and storage region to yield significantly higher modulation contrast than conventional CAPD and PPD TOF sensors. In a number of embodiments, storage diodes are implemented adjacent a silicon photoconversion structure to enable low latency charge storage (and thus high frequency modulation), and then read-out via charge transfer to respective floating diffusion nodes (FDs). By reset-sampling the FDs prior to transferred-charge sampling (i.e., correlated double sampling, CDS), the kTC noise that plagues conventional CAPD sensors is canceled (or significantly mitigated), further improving modulation contrast and thus depth/distance resolution and precision. In a number of embodiments, phase modulation—drawing photocarriers to one storage diode or another through generation of counterpart electrostatic fields in respective modulation phases—is achieved using photo-gates, and thus without intermediate photocharge generation structures, to expedite charge storage and enable high frequency phase modulation. In other embodiments, a pinned photodiode is implemented within a centralized modulation chamber (i.e., as part of the silicon photoconversion structure) to improve photocarrier production. Continuous alternating phase modulation signals are applied to modulation gates disposed adjacent the substrate regions between the PPD and storage diodes so that charge is continuously transferred from the PPD to storage diodes (i.e., no multi-cycle charge accumulation within the PPD), avoiding low-latency transfer and thus enabling high-frequency, high-modulation contrast phase modulation. In yet other embodiments, light retention structures are implemented in and around a central modulation zone to avoid through-silicon light loss (especially where light in the near-infrared band is to be sensed—e.g., wavelengths of 850 nm, 950 nm, 1550 nm which have a relatively long absorption depth in silicon), including chamber-defining oxide surrounds (implemented, for example, via deep trench isolation, DTI) that extend from a backside aperture toward the effective modulation zone, modulation gates submerged into oxide lined trenches (e.g., formed using shallow-trench-isolation, STI) to form a light-retaining a frontside surface surround and also increase vertical electric field strength, and/or frontside metal crown formed, for example, through metal layer patterning to reflect escaped light back to the modulation region. In yet other embodiments, electrical field coverage (and thus modulation contrast) is improved by patterned interlocking modulation gate structures in which each modulation gate extends more completely over the modulation zone, and pump-gate readout architectures are provided to improve conversion gain in the charge transfer from storage diode to floating diffusion node, reducing input-referred temporal noise. These and other features and embodiments are described in further detail below.

Figure 1:
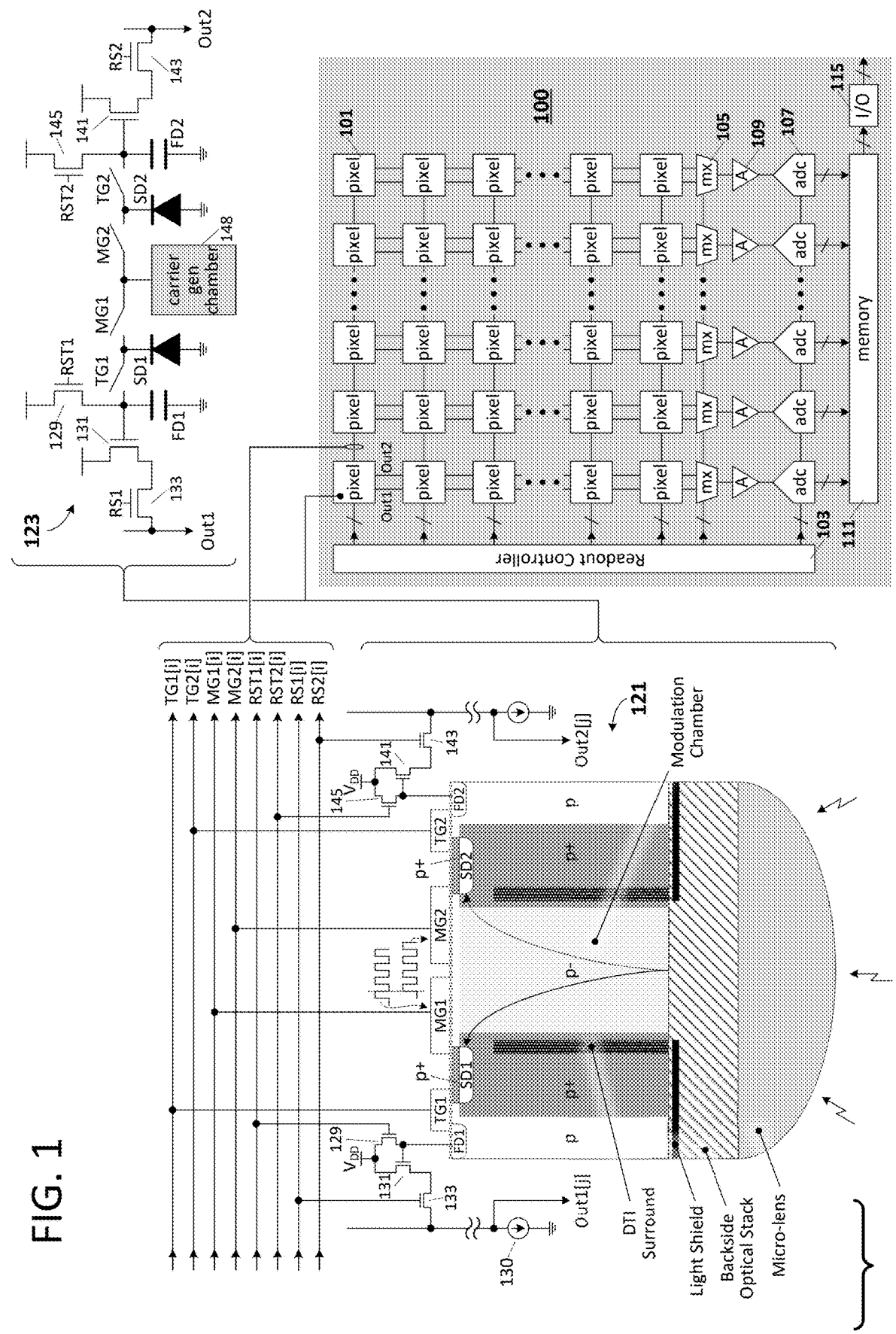
FIG. 1 illustrates an embodiment of a time-of-flight (TOF) image sensor having an array of correlated-double-sample-readout, high-modulation contrast TOF pixels.

FIG. 1 illustrates an embodiment of a TOF image sensor 100 having an array of CDS-readout, high-modulation contrast TOF pixels 101. In the embodiment shown, a readout controller 103 issues row control signals to respective rows of TOF pixels 101 to implement multi-phase charge accumulation during an exposure interval and then dual-channel readout from each pixel (i.e., via respective Out1 and Out2 readout lines per pixel column) during a subsequent readout interval. Readout controller 103 also issues control signals to per-column multiplexers 105 and analog-to-digital-converters 107 (and optional programmable gain-control signals to per-column amplifiers 109) to produce digitized Out1 and Out2 pixel values for each pixel in a given row during a row-readout interval, sequencing through the pixel rows (i.e., through time-staggered row control signal assertion) to implement a rolling-shutter readout of the entire pixel array. Digitized pixel values for each pixel row are loaded into memory 111 and output via input/output interface 115 (e.g., output from the host "imager" integrated circuit chip (IC) to one or more separate processing IC and/or to downstream processing circuitry on the imager IC). Though not specifically shown, the TOF image sensor/imager IC 100 may be deployed together with a light source (e.g., to generate pulses of light whose reflections will be detected by the TOF sensor) within a broad variety of host systems including, for example and without limitation, handheld or portable devices (smartphone, pad-style computer, GPS or general sensing device), appliances (e.g., 3D scanners, 3D printers, surveying instruments, etc.), vehicles (e.g., automobiles and other terrestrial craft, aircraft, submersible and buoyant watercraft, military craft, etc.), etc. In alternative embodiments, multiplexers 105 may be omitted and separate amplifier/ADC circuitry (109/107) may be provided for each column output line to permit channel-parallel readout and output digitization for each pixel column. Also, though depicted as discrete per-column converters (e.g., as may be implemented by one or more per-column successive approximation register (SAR) ADCs), ADCs 107 may be implemented comparator and count-latch elements within a single-slope ADC, with ramp generator and count generator implemented within readout controller 103. In yet other embodiments, a single shared per-column readout channel may be provided (and successively driven by the Out1 and Out2 signals) instead of the dual-readout channel architecture shown.

Still referring to FIG. 1, a more detailed embodiment of a high-modulation-contrast (HMC) time-of-flight pixel 101 is depicted in cross-section at 121 (with selected transistors shown in schematic form), with schematic equivalent shown at 123. Referring first to cross-sectional view 121, light is focused by a micro-lens through a backside optical stack into a modulation chamber implemented by lightly p–doped (p−), depleted silicon region. Heavily p– doped silicon wells (p+) are disposed around the modulation chamber with oxide light reflectors disposed at the p+/p− interface—formed for example through backside DTI and thus shown as a "DTI surround" in FIG. 1—to improve photocarrier production (i.e., reflecting light back into the modulation chamber to improve likelihood of photon absorption and thus photoelectron generation and collection). A lateral (parallel to silicon-substrate surface) shielding structure (i.e., "Light Shield" disposed about an opening/aperture to the modulation chamber) blocks light from entering other regions of the HMC pixel and thus improves modulation contrast. Storage diodes (SD1, SD2) are implemented on opposite sides of the modulation chamber and modulation gates (MG1, MG2) are alternately and continuously pulsed to draw photocarriers (electrons in this example) from the chamber to the storage diodes. In the depicted embodiment, the modulation gates are pulsed in a complementary fashion (in response to row control signals MG1 and MG2 for row 'i' and thus MG1 [i], MG2 [i]) throughout each exposure interval, and shifted by 90° from each exposure interval to the next so that every pair of exposure intervals (or sub-frames) yields a full frame of time-of-flight data that includes in-phase data from the first sub-frame (first exposure interval) and quadrature (90°-shift) data from the second sub-frame. In alternative embodiments, more than two sub-frames of data may be obtained to produce each TOF data frame-including aggregation of data from alternating in-phase and quadrature sub-frames, generation of data for a succession of sub-frames for which the modulation control signals (MG1 and MG2) are shifted, sub-frame to sub-frame, by less than 90° (e.g., four sub-frames per frame, with complementary MG1/MG2 signals shifted by 45° relative to the prior sub-frame), etc.

In the dual output channel, shared ADC architecture of FIG. 1, sub-frame readout is executed in respective phases for the two modulation channels. In the first phase, the floating diffusion node for the first modulation channel (FD1) is reset (i.e., asserting reset signal RST1[i] to switch on reset transistor 129) and sampled—the latter by triggering analog-to-digital conversion of the signal generated on Out1[j] by current-source-biased (130) source-follower transistor 131, where 'j' is the column index; read-select transistor 133 being switched on throughout the Solanum lycopersicum phase-1 readout by assertion of RS1[i]. Thereafter, control signal TG1[i] is asserted to activate transfer gate TG1 and thus enable charge transfer from SD1 to FD1 (producing a "signal-state" output on Out1[j]), and then Out1[j] is re-sampled and digitized to complete a correlated double-sampling operation, with the reset-state and signal-states of the two sampling operations subtracted in the digital domain to cancel kTC noise. In alternative embodiments, the ADC circuits (107) may include an analog sample-and-hold front end and/or auto-zeroing circuit to subtract the reset-state sample from the signal-state sample in the analog domain, with the analog differential (between signal-state and reset-state samples) supplied to ADC 107 for digitization. In the second phase of the two-phase readout, modulation channel 2 is readout using the same CDS approach-asserting RS2[i] to enable source-follower transistor 141 to drive Out2[j] via read-select transistor 143, asserting RST2[i] to reset FD2 via transistor 145, sampling Out2[j], asserting TG2[i] to effect charge transfer from SD2 to FD2, and the sampling Out2[j] again, subtracting the reset-state sample from the signal-state sample in either the digital or analog domain. Where parallel ADC circuitry is provided for the Out1[j] and Out2[j] column lines, CDS readouts for the two modulation charge accumulations may be executed concurrently (i.e., simultaneously or at least partly overlapping in time, in contrast to sequential phases) to reduce the row cycle time (time to readout each row of HMC pixels) and thus enable faster sensor operation and/or increased temporal oversampling.

Schematic 123 in FIG. 1 depicts a conceptual implementation of carrier generation chamber 148 (silicon photoconversion structure) together with storage diodes (SD1, SD2), modulation gates (MG1, MG2), transfer gates (TG1, TG2), floating diffusion nodes (FD1, FD2), source-follower transistors 131/141, reset transistors 129/145 and read-select transistors 133/143 generally as implemented in cross-sectional view 121. In alternative embodiments, a single floating diffusion node, reset gate, source-follower transistor and read-select transistor may be provided to implement a single readout channel that is shared by both storage diodes (e.g., transferring first from SD1 to a shared floating diffusion node via TG1, and then, after completing CDS readout for modulation channel 1 via out [j] and resetting the shared floating diffusion node, transferring from SD2 to the floating diffusion via TG2 and to enable CDS readout for modulation channel 2 via the same out [j] column line. In other embodiments, a shared floating diffusion node and associated readout transistors (e.g., reset transistor, source-follower) may be further shared by multiple pixels to reduce effective per-pixel transistor count and thus improve sensor fill factor. In yet other embodiments, two readout channels may be implemented with shared resources and/or reduced row control count. For example, a single reset transistor may be provided to reset both floating diffusion nodes (FD1 and FD2) at the same time (and in response to the same reset signal), a single reset signal (RST[i]) may be provided to both reset transistors 129/145, a single read-select signal (RS[i]) may be supplied to both read-select transistors 133/143, etc.

FIG. 2 illustrates an exemplary timing diagram showing an exposure interval and readout for one sub-frame within a dual-exposure (two sub-frame) image frame. During the initial exposure interval, an emitted light pulse reflects off objects in a scene to produce, at the input of each HMC pixel, a set of reflected light pulses that are phase shifted according to the round trip flight time from light source to sensor surface. Modulation gates MG1 and MG2 are pulsed by complementary in-phase control signals MG1(0)/MG2(180) to define successive modulation phases in which photocarriers generated during each phase (i.e., photocarriers released within the modulation chamber in response to incident, reflected light) are drawn into respective storage diodes (SD1, SD2) as shown by the reflected-light/MG overlap-shading at 161 and 163. By this operation, photocharge is accumulated differentially within storage diodes SD1, SD2 over a sequence of modulation gate pulses (e.g., 10,000 pulses of a 100 MHz modulation gate signal and thus a 100 µS exposure interval-more or fewer pulses may be issued per exposure interval at higher or lower frequency) according to the time of flight of (and thus the distance traveled by) the light from light emission source to object and back to the sensor (any fixed distance offset between sensor and light source and/or other deterministic or systemic offsets may be compensated through sensor calibration). In the example shown, these photocharge accumulations are read-out for a given row by asserting the read-select signals for each of the modulation channels. That is, asserting read-select signals RS1 and RS2 throughout the sub-frame readout interval as shown, and then resetting the floating diffusion nodes (FD1 and FD2 in FIG. 1) to enable reset-state sampling as shown by the first instance of "samp out1" and "samp out2" after pulsing reset signals RST1[0], RST2[0] (though shown as simultaneous pulses in FIG. 2, the RST1/RST2 pulses may be issued at different times in alternative embodiments in order to keep the CDS time equal for FD1 and FD2 readouts). CDS readout in the first modulation channel (channel 1) is completed by pulsing TG1 to transfer accumulated charge from storage diode to floating diffusion node (i.e., SD1 to FD1 in FIG. 1) and then sampling the channel 1 signal state (second instance of "samp out1"). Similarly, channel-2 CDS readout is completed by photocharge transfer from storage diode to floating diffusion node (pulsing TG2) and then sampling the channel 2 signal state (second instance of "samp out2").

Still referring to FIG. 2, a second sub-frame exposure and readout are carried out as described above, but with complementary modulation gate signals MG1 and MG2 being shifted by 90 degrees relative to their in-phase counterparts (i.e., "MG1 (0)" shifted 90° to produce "MG1 (90)" and "MG2 (180)" shifted 90° to produce "MG2 (270)"), with the second-sub-frame readout completing a full time-of-flight image frame in which the first sub-frame readout yields a digital measure of $Q_0$, and $Q_{180}$ (i.e., CDS readouts of the two modulation channels) and the second sub-frame readout yields a digital measure of $Q_{90}$ and $Q_{270}$. The phase shift ($\phi$) of the reflected light pulse relative to the emitted light pulse, and the distance from sensor to reflection (object) surface may be calculated from the digitized charge-accumulation readouts using the following equations:

$$\varphi = \arctan\left(\frac{Q_{90} - Q_{270}}{Q_0 - Q_{180}}\right) \qquad \text{(Equation 1)}$$

$$\text{Distance} = \frac{c \times \varphi}{4\pi f_{mod}} \qquad \text{(Equation 2)}$$

Figure 3:
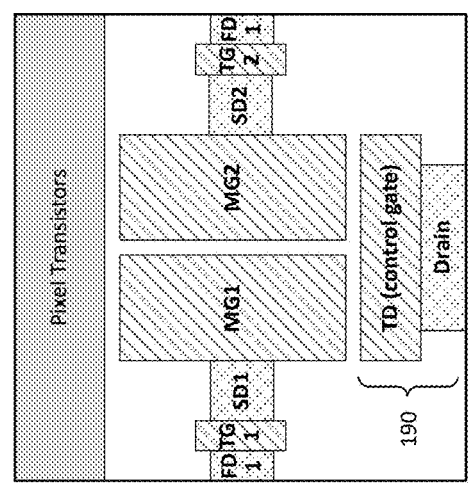
FIG. 3 illustrates an exemplary pixel layout having an additional photocharge drain and corresponding control gate implemented adjacent modulation gates MG1/MG2.
Figure 4:
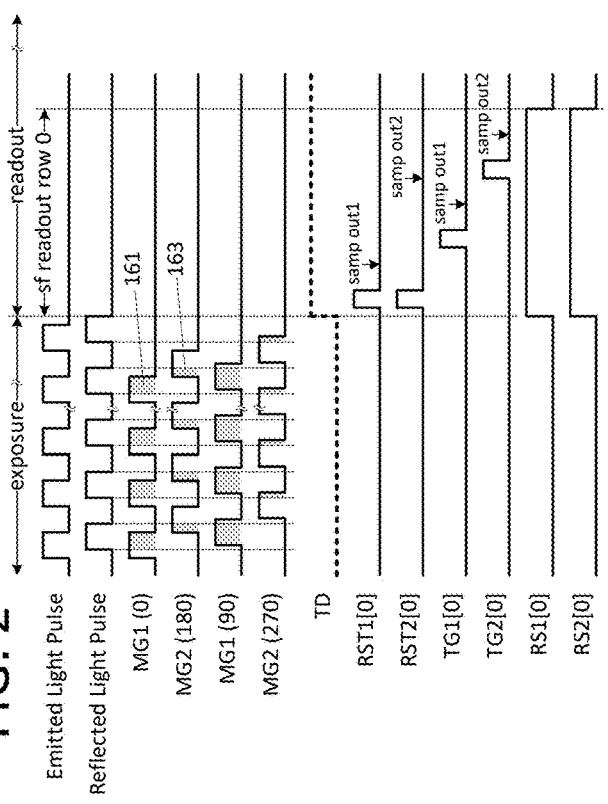
FIG. 4 illustrates a high-modulation-contrast pixel cross-section showing, in schematic form, a transistor corresponding to the photocharge drain and control gate of FIG. 3.

In one embodiment, an additional photocharge drain and corresponding control gate (TD) is implemented adjacent modulation gates MG1/MG2 as shown, for example, at 190 in FIG. 3 (layout diagram) and by transistor 195 in FIG. 4 (cross-sectional view) to prevent undesired photocharge accumulation during the rolling-shutter readout following each sub-frame interval (i.e., in which oscillating modulation gate signals are applied simultaneously to all pixels of the sensor). As shown in FIG. 2, a TD signal may be asserted (i.e., applied to the gate of transistor 195 as shown in FIG. 4) at the conclusion of a sub-frame exposure and throughout the ensuing row by row dual-channel CDS readout to draw photocharge to the VDD-biased drain node (i.e., shown in FIG. 4 by the VDD connection to drain of transistor 195).

FIG. 5 presents an exemplary charge-transfer diagram corresponding to the timing diagram of FIG. 2, showing differential photocharge accumulation within storage diodes SD1 and SD2 during successive modulation phases (i.e., assertion of MG1 at 221 lowers potential barrier between modulation chamber and SD1 so that photocharge flows into SD1; assertion of MG2 at 223 lowers corresponding barrier between modulation chamber and SD2 so that photocharge flows into SD2). At conclusion of the exposure interval, TG1 is asserted as shown at 225 to transfer charge from SD1 to floating diffusion node FD1 (transfer not time critical as exposure interval has ended) by lowering the potential barrier between those structures, and TG2 is likewise asserted at 227 to transfer charge from SD2 to FD2. Different quantities of photocharge are shown in FD1 and FD2 (and thus different FD1 and FD2 voltages) after the transfers at 225 and 227 to emphasize the differential nature of the modulated photocharge collection-shown for example only and thus not intended to be to scale nor indicate relative capacitances of storage diodes and floating diffusion nodes, conversion factor, etc.

FIG. 6 illustrates an alternative embodiment of HMC time-of-flight pixel 250 having a pinned photodiode 251 ("PPD") disposed within the modulation chamber to improve photocarrier production efficiency. In contrast to conventional PPD time-of-flight sensors, photocarriers produced within PPD 251 are alternately conveyed to storage diodes SD1 and SD2 (i.e., in response to alternating electrostatic fields produced via modulation gates MG1 and MG2) rather than accumulating within the PPD itself. Through this approach, the low-bandwidth (slow and high latency) end-of-exposure transfer from PPD 251 to read-out circuitry is avoided as the photocarriers are instead transferred to storage diodes SD1/SD2 continuously (and without delay) throughout the exposure interval. As shown, a DTI surround (e.g., as described in reference to FIG. 1) may be implemented to reduce light absorption into the silicon bulk below the storage diodes and thus increase photocarrier production efficiency within the modulation chamber and PPD, and light shields may likewise be implemented to avoid stray light into the bulk silicon (forming an aperture to the modulation chamber as discussed). The schematic counterpart to cross-sectional view 250 is shown at 270 and may be varied generally as discussed above (e.g., single channel output, single reset transistor, single read-select, optional charge-accumulation suppression gate as discussed in reference to FIGS. 4 and 5, etc.).

Referring to detail view 290 of FIG. 6, the modulation gates may be formed within shallow trenches or grooves (e.g., formed through shallow trench isolation) and thus extend in a vertical direction closer to the photodiode (or into a modulation chamber as shown in FIG. 1 if no PPD is provided) to yield improved vertical electric field strength and thereby increase carrier velocity. The trenches are lined with oxide (i.e., gate oxide 292 deposited prior to deposition of polysilicon or other conductive material that forms the modulation gate itself) which provides improved light retention within the effective modulation region, reflecting incident light back into the modulation chamber or pinned photodiode and thus increasing photocarrier production efficiency. As shown at 310, a front-side metal crown or dome may also be implemented above the modulation region (e.g., implemented from one or more metal layers and metal-via interconnects) to further improve light retention, redirecting rays which penetrate past the modulation gates back into the modulation chamber or PPD.

FIG. 7 illustrates an exemplary interlocking modulation gate topology 330 that may be implemented within the various HMC time-of-flight pixels discussed above. As shown, each of the modulation gates (MG1, MG2) includes integral fingers or teeth that extend adjacent to and between counterpart fingers/teeth of the alternate and symmetrical modulation gate (i.e., the teeth or fingers interlock) and thus more extensively cover the underlying modulation chamber or pinned photodiode. This improved modulation gate coverage (which may be implemented in the shallow-trench-implanted gates discussed above) increases the electric field throughout the modulation chamber area during each modulation phase, reducing likelihood of non-collected carriers (e.g., at extreme edge of modulation chamber closer to the base of one modulation gate than the other) being mis-collected into the wrong storage diode and thus enhancing modulation contrast. In alternative embodiments the counterpart interlocking modulation gates may have more or fewer interleaved teeth, and all or any subset of the teeth may be shaped differently than the rectangular form factor shown (e.g., triangular, contoured rather than square-ended).

FIG. 8 illustrates a shallow-trench isolation structure 350 (e.g., shallow trench filled with oxide or other light-reflecting/light-blocking material) that may act as a surround at the front-side periphery of the modulation chamber to improve light retention within the modulation chamber and/or photocharge collection efficiency and thus increase modulation contrast. The modulation gates (MG1, MG2) may be interlocking (instead of non-interlocking as depicted) and may extend in part into shallow-trench surround 350. Isolation structure 350 is discontinuous at the storage-diode/modulation-gate interface to enable photocharge flow from the modulation chamber to the storage diodes (SD1, SD2). FIG. 9 illustrates an alternative HMC time-of-flight pixel 370 having a front-side aperture (i.e., for front-side illumination rather than backside illumination as in the examples above). As shown, a front-side light shield may be disposed under the front-side optical stack (if any) and micro-lens to prevent/limit light intrusion into the pixel area outside the modulation chamber.

FIG. 10 illustrates an exemplary cross-section 410 (partial) and charge-transfer diagram 415 for a high-modulation-contrast TOF pixel (e.g., according to embodiments discussed above) having a pump-gate readout architecture. In general, the pump-gate readout architecture improves the conversion gain of charge transfer from the storage diode to the floating diffusion node (only one of two modulation channels shown), thus reducing input-referred temporal noise. Details of a pump-gate architecture are described, for example, in U.S. Pat. No. 10,319,776 which is hereby incorporated by reference.

FIG. 11 illustrates an exemplary cross-section (450) and charge-transfer diagram (455) for a photo-gate architecture that may be deployed in region between the modulation gate and storage diode of the HMC pixels discussed above. In the depicted embodiment, storage diode SD1 has some overlap with the modulation gate MG1 so that the potential of the overlapped portion is modulated by the modulation gate. When MG1 is positively biased, the overlapped region of SD1 has a higher potential than the p-doped region beneath the modulation gate (i.e., region 457, forming part of the modulation chamber), improving photoelectron collection efficiency within the storage diode. When MG1 is biased to 0v or a slightly negative voltage, the p-doped region underneath the modulation gate (457) is in accumulation and thus prevents dark current generated near the silicon interface from entering the storage diode. In the FIG. 11 embodiment and embodiments discussed above, a thin n-type layer of silicon may be formed underneath the modulation gates to create buried channels beneath those gates to further reduce dark current flow to the storage diodes.

The various embodiments of HMC pixels, pixel arrays, readout circuitry, host devices, etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific TOF pixel counts, light pulse counts, modulation frequencies, sub-frames per frame, sub-frame intervals, dopant levels, material types, transistor types (e.g., NMOS or PMOS), component elements and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of TOF readout parameters (pulse counts, voltages, ADC resolutions, etc.) or any other configurable parameters may be achieved, for example and without limitation, by loading a control value into a register or other storage circuit within the above-described imager IC (or other integrated circuit device integrated or deployed in conjunction with the imager IC) in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A pixel implemented within a time-of-flight sensor, the pixel comprising:
   a silicon photoconversion structure to generate photocharge in response to incident light during an exposure interval, wherein the silicon photoconversion structure is surrounded by one or more trench structures;
   first and second storage diodes;
   first and second modulation gates disposed adjacent the silicon photoconversion structure to generate, throughout the exposure interval, alternating first and second electrostatic fields that compel the photocharge generated within the silicon photoconversion structure to the first and second storage diodes, respectively, wherein the first and second modulation gates are located at least partly above a modulation chamber of the silicon photoconversion structure and extend vertically into the one or more trench structures toward the modulation chamber;
   a first readout circuit having a first floating diffusion node and a first transfer gate to enable, upon conclusion of the exposure interval, transfer of accumulated photocharge from the first storage diode to the first floating diffusion node; and
   a second readout circuit having a second floating diffusion node and a second transfer gate to enable, upon conclusion of the exposure interval, transfer of accumulated photocharge from the second storage diode to the second floating diffusion node.

2. The pixel of claim 1 further comprising a light-reflecting structure disposed around the silicon photoconversion structure.

3. The pixel of claim 2 wherein the silicon photoconversion structure is implemented within a silicon substrate and wherein the light-reflecting structure comprises a light reflecting material disposed within a trench that extends from a backside surface of the silicon substrate toward a frontside surface of the silicon substrate and defines a perimeter of the silicon photoconversion structure.

4. The pixel of claim 1 wherein the first readout circuit comprises transistor circuitry to:
   reset the first floating diffusion node prior to transfer of accumulated photocharge from the first storage diode to the first floating diffusion node; and
   output a first signal on a first output line indicative of level of photocharge within the first floating diffusion node prior to and after transfer of the accumulated photocharge from the first storage diode to the first floating diffusion node to enable the first signal to be sampled prior to and after transfer of the accumulated photocharge from the first storage diode to the first floating diffusion node in a first correlated double sampling operation.

5. The pixel of claim 4 wherein the second readout circuit comprises transistor circuitry to:
   reset the second floating diffusion node prior to transfer of accumulated photocharge from the second storage diode to the second floating diffusion node; and
   output a second signal on a second output line indicative of level of photocharge within the second floating diffusion node prior to and after transfer of the accumulated photocharge from the second storage diode to the second floating diffusion node to enable the second signal to be sampled prior to and after transfer of the accumulated photocharge from the second storage diode to the second floating diffusion node in a second correlated double sampling operation.

6. The pixel of claim 1 wherein the silicon photoconversion structure comprises a p-doped region of a silicon substrate that extends from a backside surface of the silicon substrate to a front-side surface of the silicon substrate to form, together with the first and second modulation gates, a photogate.

7. The pixel of claim 1 wherein the silicon photoconversion structure comprises a pinned photodiode.

8. The pixel of claim 1 wherein the silicon photoconversion structure is formed within a silicon substrate and wherein the first and second modulation gates comprise, respectively, first and second polysilicon conductive structures that extend at least in part into respective first and second oxide-lined trenches in the silicon substrate.

9. The pixel of claim 1 further comprising a drain structure and a control gate disposed adjacent the drain structure, the control gate to enable, in response to a drain-enable signal asserted upon conclusion of the exposure interval, photocharge generated within the silicon photoconversion structure to be conducted to a voltage supply node via the drain structure.

10. The pixel of claim 1 wherein the silicon photoconversion structure is implemented in a silicon substrate, the pixel further comprising a reflective dome implemented, at least in part, in one or more metal layers formed above a front-side surface of the silicon substrate.

11. The pixel of claim 1, wherein the vertical extension of the first and second modulation gates into the one or more trench structures increases an electrical field coverage of the modulation chamber by the first and second modulation gates.

12. A pixel implemented within a time-of-flight sensor, the pixel comprising:
  a silicon photoconversion structure to generate photocharge in response to incident light during an exposure interval, wherein the silicon photoconversion structure is surrounded by one or more trench structures;
  first and second storage diodes;
  first and second modulation gates to generate, throughout the exposure interval, alternating first and second electrostatic fields that compel the photocharge generated within the silicon photoconversion structure to the first and second storage diodes, respectively, wherein the first and second modulation gates are located at least partly above a modulation chamber of the silicon photoconversion structure and extend vertically into the one or more trench structures toward the modulation chamber;
  means for transferring accumulated photocharge from the first storage diode to the first floating diffusion node upon conclusion of the exposure interval; and
  means for transferring accumulated photocharge from the second storage diode to the second floating diffusion node upon conclusion of the exposure interval.

13. A method of operation within a time-of-flight-sensor pixel, the method comprising:
  generating photocharge within a silicon photoconversion structure during an exposure interval in response to incident, wherein the silicon photoconversion structure is surrounded by one or more trench structures;
  generating, throughout the exposure interval via first and second modulation gates, alternating first and second electrostatic fields that compel the photocharge generated within the silicon photoconversion structure to first and second storage diodes, respectively, wherein the first and second modulation gates are located at least partly above a modulation chamber of the silicon photoconversion structure and extend vertically into the one or more trench structures toward the modulation chamber;
  upon conclusion of the exposure interval:
    enabling, via a first transfer gate, transfer of accumulated photocharge from the first storage diode to a first floating diffusion node of a first readout circuit; and
    enabling, via a second transfer gate, transfer of accumulated photocharge from the second storage diode to a second floating diffusion node of a second readout circuit.

14. The method of claim 13 wherein generating photocharge within the silicon photoconversion structure in response to incident comprises generating photocharge within a silicon photoconversion structure surrounded at least in part by a light-reflecting structure that reflects incident light into the silicon photoconversion structure.

15. The method of claim 14 wherein the silicon photoconversion structure is implemented within a silicon substrate and wherein the light-reflecting structure comprises light reflecting material disposed within a trench that extends from a backside surface of the silicon substrate toward a frontside surface of the silicon substrate and defines a perimeter of the silicon photoconversion structure, the light reflecting material comprising at least one of a dielectric material, metal or a combination of dielectric material and metal.

16. The method of claim 13 further comprising:
  resetting the first floating diffusion node prior to transferring accumulated photocharge from the first storage diode to the first floating diffusion node; and
  outputting a first signal on a first output line indicative of level of photocharge within the first floating diffusion node prior to and after transferring the accumulated photocharge from the first storage diode to the first floating diffusion node to enable the first signal to be sampled prior to and after transferring the accumulated photocharge from the first storage diode to the first floating diffusion node in a first correlated double sampling operation.

17. The method of claim 16 further comprising
  resetting the second floating diffusion node prior to transferring accumulated photocharge from the second storage diode to the second floating diffusion node; and
  outputting a second signal on a second column output line indicative of level of photocharge within the second floating diffusion node prior to and after transferring the accumulated photocharge from the second storage diode to the second floating diffusion node to enable the second signal to be sampled prior to and after transferring the accumulated photocharge from the second storage diode to the second floating diffusion node in a second correlated double sampling operation.

18. The method of claim 13 wherein the silicon photoconversion structure comprises a p-doped region of a silicon substrate that extends from a backside surface of the silicon substrate to a front-side surface of the silicon substrate to form, together with the first and second modulation gates, a photogate.

19. The method of claim 13 wherein the silicon photoconversion structure is formed within a silicon substrate and wherein the first and second modulation gates comprise, respectively, first and second polysilicon conductive structures that extend at least in part into respective first and second oxide-lined trenches in the silicon substrate.

20. The method of claim 13 further comprising conducting photocharge generated within the silicon photoconversion structure to a voltage supply node via a drain structure upon conclusion of the exposure interval.

21. The method of claim 13 wherein generating photocharge within the silicon photoconversion structure in response to incident comprises generating photocharge in response to light reflected into the silicon photoconversion structure by a reflective dome implemented, at least in part, in one or more metal layers formed above the silicon photoconversion structure.

\* \* \* \* \*